United States Patent [19] [11] 3,723,894

Benenati [45] Mar. 27, 1973

[54] AUTOMATIC GAIN CONTROL CIRCUIT

[75] Inventor: Robert L. Benenati, Depew, N.Y.

[73] Assignee: GTE Sylvania Incorporated

[22] Filed: Aug. 13, 1971

[21] Appl. No.: 171,477

[52] U.S. Cl. ....................................330/29, 330/145
[51] Int. Cl. ............................................H03g 3/30
[58] Field of Search .........330/29, 145; 325/319, 413

[56] References Cited

UNITED STATES PATENTS

| | | | |
|---|---|---|---|
| 3,624,561 | 11/1971 | Tongue | 330/29 X |
| 3,243,719 | 3/1966 | Scaroni | 330/145 X |
| 3,244,997 | 4/1966 | Wruk | 330/29 X |
| 3,222,609 | 12/1965 | Ulmer et al. | 330/145 X |
| 3,522,453 | 8/1970 | Simons et al. | 330/145 X |

OTHER PUBLICATIONS

Sherwin et al., "Fets as Constant Current Sources," EEE, October 1967, pp. 82–85.

*Primary Examiner*—John Kominski
*Assistant Examiner*—James B. Mullins
*Attorney*—Norman J. O'Malley et al.

[57] ABSTRACT

VHF cascode amplifier having a PIN diode in series with its input. The RF impedance of the PIN diode varies inversely with the DC current through it. A constant DC current source including a constant current diode supplies DC current to the PIN diode. A bypass transistor has its collector connected to the constant current source and its base coupled to the amplifier output. Variations in the peak amplitude of the amplifier output cause variations in the current flow through the bypass transistor. The resulting change in DC current flow in the PIN diode changes its RF impedance so as to overcome the change in the amplifier output and maintain the output level constant.

7 Claims, 1 Drawing Figure

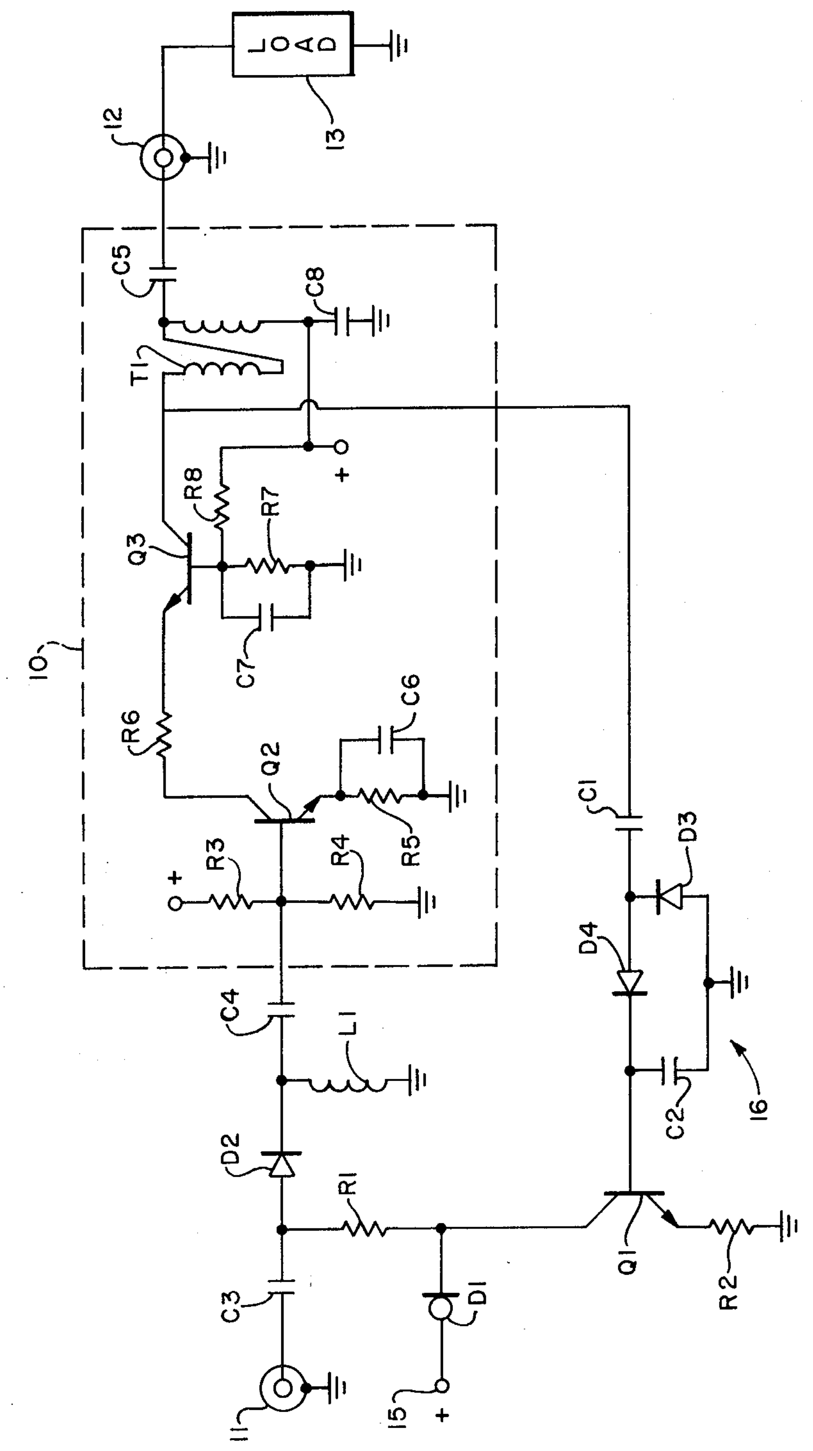
INVENTOR.
ROBERT L. BENENATI
BY David M Keay
AGENT

AUTOMATIC GAIN CONTROL CIRCUIT

BACKGROUND OF THE INVENTION

This invention relates to amplifier circuits. More particularly, it is concerned with RF amplifiers having automatic gain control (AGC) circuitry.

Various well known circuitry for obtaining automatic gain control of transistorized RF amplifiers can be classified generally as employing one of two techniques. In one technique, known as reverse AGC, the collector current of the input transistor stage is varied while the collector voltage is maintained substantially constant. In the second technique, known generally as forward AGC, the collector-base voltage of the input transistor stage is varied in accordance with the collector current. With both techniques gain control is achieved by shifting the DC bias point of the transistor.

However, shifting the DC bias point of a transistor may cause the transistor to operate at a point on its characteristic curve such that a large amount of harmonic distortion will be produced if the transistor is driven to cutoff or saturation. Thus, the two known techniques of obtaining automatic gain control cause the input signal dynamic range of the amplifier to be limited by the amount of output signal distortion which can be tolerated. In addition, the characteristics of the same type of transistor vary from device to device, thus making it difficult to obtain uniform effects of gain control from amplifier to amplifier.

SUMMARY OF THE INVENTION

RF amplifier circuits employing AGC circuitry in accordance with the present invention eliminate problems caused by bias point shift and variations in device characteristics. The apparatus includes an RF amplifier circuit means having an input connection and an output connection. A variable RF impedance means, such as a PIN diode, is connected in series between an input terminal and the input connection of the RF amplifier circuit means. The value of the RF impedance of the variable RF impedance means is inversely related to the DC current passing through the diode. A constant current means for producing a constant DC current is coupled to the variable RF impedance means. A bypass means is coupled to the constant current means and to the output connection of the RF amplifier circuit means. The bypass means permits current from the constant current means to pass therethrough in relation to the amplitude of the signal occurring at the output connection of the RF amplifier circuit means. Thus, a change in the amplitude of the output signal from the RF amplifier circuit means changes the amount of DC current flowing through the bypass means and consequently through the variable RF impedance means, thereby changing the value of the RF impedance and providing automatic gain control.

BRIEF DESCRIPTION OF THE DRAWING

Additional objects, features, and advantages of amplifier circuits employing automatic gain control circuitry in accordance with the present invention will be apparent from the following detailed discussion together with the accompanying drawing wherein the single FIGURE is a schematic circuit diagram of a VHF cascode amplifier employing automatic gain control circuitry in accordance with the invention.

DETAILED DESCRIPTION OF THE INVENTION

A VHF cascode amplifier circuit employing automatic gain control circuitry in accordance with the invention is illustrated in the drawing. The apparatus includes a two-stage transistor amplifier 10, an input terminal 11, and an output terminal 12 to which a load 13 is connected. The input terminal 11 is connected to the input connection of the amplifier 10 by a capacitance C3, a diode D2, a capacitance C4, and an inductance L1 connected from the juncture of diode D2 and capacitance C4 to ground. The diode D2 is a device, for example, a PIN semiconductor diode, having an impedance to RF signals that is inversely related to the DC current passing through the diode.

A positive voltage supply 15 is connected through a constant current diode D1 and a resistance R1 to the juncture of the capacitance C3 and diode D2. Diode D1 has the characteristic of maintaining the current passing through it constant over a wide range of voltage supply variations. An NPN bypass transistor Q1 has its collector connected directly to the juncture of diode D1 and resistance D1 and its emitter connected to ground through a control resistance R2. Its base is coupled to the output of the amplifier 10 by a peak amplitude detector feedback network 16. The combination of capacitances C1 and C2 and diodes D3 and D4 shown is a peak detector voltage doubler network. The network is connected to the collector of the final transistor stage Q3 of the amplifier 10.

The apparatus as described and as shown in the figure operates in the following manner. When there is no output from the amplifier 10, the bypass transistor Q1 is biased to the non-conducting condition. Thus, all of the constant current flowing through diode D1 flows through resistance R1, diode D2, and inductance L1 to ground. Since the RF impedance of diode D2 is inversely related to the DC current passing through it, a relatively low value of RF impedance is provided, and the attenuation of RF signals applied at the input terminal and passing through capacitance C3, diode D2, and capacitance C4 is negligible.

When an RF output signal is being produced by the amplifier 10, the peak amplitude of the RF signal is detected and doubled by the feedback network 16 and applied to the base of the bypass transistor Q1. When the peak amplitude of the RF signal is sufficient to bias the bypass transistor Q1 to conduction, current flow in its collector circuit is supplied from the constant current diode D1. Since the current from diode D1 remains constant, the current drawn by transistor Q1 is subtracted from that passing through diode D2. Thus, it can be seen that an increase in current through transistor Q1 causes an equivalent decrease in current through diode D2 and, therefore, an increase in the impedance that diode D2 present to RF signals passing from the input terminal 11 to the amplifier 10. Automatic gain control is thereby achieved since any change in the output signal causes a change in current flow in the bypass transistor Q1 thus changing the attenuation of the input signal by diode D2 and stabilizing operation of the circuit at a substantially constant output voltage.

The output level of the amplifier at which automatic gain control action occurs may be increased or decreased by changing the value of the control resistance R2 and thus varying the DC loop gain of the gain control circuit. That is, in order to increase the output voltage level at which the automatic gain control occurs, resistance R2 is increased in value. A larger voltage must then be applied to the base of bypass transistor Q1 in order to cause an equivalent amount of current to flow in transistor Q1. Since an increase in voltage at the base of bypass transistor Q1 requires an increase in the RF output voltage from the amplifier 10, the point at which automatic gain control is initiated is determined by the value of the control resistance R2. Thus, it can be seen that the output voltage level can be changed without effecting any change in the DC bias conditions of the transistor amplifier 10 itself.

Apparatus in accordance with the invention as described hereinabove produces no change in the DC bias point of the amplifying transistors for changes in the level of the amplifier output despite variations in the gain control signals. In addition, the characteristics of the transistors are not involved in the gain control circuitry. The automatic gain control circuitry is relatively simple and operates for extremely wide band HF, VHF, and UHF amplifiers. Furthermore, adjustment of the amplifier output level is readily obtained by merely varying the value of the control resistance R2 connected to the emitter of the bypass transistor Q1.

Following is a list of component values for an embodiment of a VHF cascode amplifier as illustrated in the FIGURE.

| | |
|---|---|
| Q1 | 2N3904 type NPN transistor |
| Q2 | Motorola type MPS918 NPN transistor |
| Q3 | Motorola type MPS918 NPN transistor |
| D1 | 1N5297 |
| D2 | Sylvania type D5760D |
| D3 | 1N4532 |
| D4 | 1N4532 |
| R1 | 2K ohms |
| R2 | 33 ohms |
| R3 | 12K OHMS |
| R4 | 2.7K ohms |
| R5 | 180 ohms |
| R6 | 47 ohms |
| R7 | 6.8K ohms |
| R8 | 9.1K ohms |
| C1 | 0.01 μf |
| C2 | 0.01 μf |
| C3 | 0.01 μf |
| C4 | 0.01 μf |
| C5 | 0.01 μf |
| C6 | 0.01 μf |
| C7 | 0.01 μf |
| C8 | 0.01 μf |
| L1 | 10 μh |
| T1 | 2-to-1 step-down balum signal transformer |
| + voltages | 18 volts |

The apparatus operated to produce an output variation of less than 2dB into a 50 ohm load with an input signal level variation of 10dB for frequencies between 30 and 90 megahertz. The 0dB level was 290 millivolts RMS.

While there has been shown and described what is considered a preferred embodiment of the present invention, it will be obvious to those skilled in the art that various changes and modifications may be made therein without departing from the invention as defined by the appended claims.

What is claimed is:

1. In combination

RF amplifier circuit means having an input connection and an output connection;

an input terminal;

variable RF impedance means connected in series between the input terminal and the input connection of the RF amplifier circuit means, the value of the RF impedance of the variable RF impedance means being inversely related to the DC current passing therethrough;

constant current means for providing a constant DC current;

coupling means coupling said constant current means to the variable RF impedance means and providing a first DC current path through the variable RF impedance means for DC current from the constant current means; and bypass means coupled to the constant current means and to the output connection of the RF amplifier circuit means and providing a second DC current path therethrough for DC current from the constant current means;

said first DC current path through the coupling means and variable RF impedance means being in parallel with the second DC current path through the bypass means, the sum of the DC currents through the first and second DC current paths being equal to the constant DC current from the constant current means;

said bypass means being operable to permit DC current from the constant current means to pass therethrough in relation to the amplitude of the signal at the output connection;

whereby a change in the amplitude of the output signal from the RF amplifier circuit means changes the amount of DC current flowing through the bypass means and consequently through the variable RF impedance means thereby changing the value of its RF impedance.

2. The combination in accordance with claim 1 wherein said variable RF impedance means includes a semiconductor diode having a value of impedance to RF signals which is inversely proportional to the amount of DC current passing therethrough.

3. The combination in accordance with claim 2 including first circuit means connected between the input terminal and the semiconductor diode for permitting the flow of RF current from the input terminal to the semiconductor diode and preventing the flow of DC current from the constant current means to the input terminal; and second circuit means connected between the semiconductor diode and the input connection of the RF amplifier circuit means for permitting the flow of RF current from the semiconductor diode to the RF amplifier circuit means and preventing the flow of DC current from the semiconductor diode to the RF amplifier circuit means.

4. The combination in accordance with claim 3 wherein said bypass means includes a bypass transistor having its collector coupled to the constant current means and its emitter connected through a control resistance to a first source of reference potential; and amplitude detection means coupled to the output connection of the RF amplifier circuit means and to the base of the bypass transistor and operable to apply a biasing voltage at the base of the bypass transistor proportional to the amplitude of the RF output signal from the RF amplifier circuit means.

5. The combination in accordance with claim 4 wherein said amplitude detection means includes a peak amplitude detector voltage doubler network.

6. The combination in accordance with claim 5 wherein said constant current means includes a constant current diode having one terminal connected to a second source of reference potential and the other terminal connected to the collector of the bypass transistor and through a resistance to the semiconductor diode;

said first circuit means includes a capacitance connected between the input terminal and the juncture of the semiconductor diode and the last-mentioned resistance; and said second circuit means includes an inductance connected between the semiconductor diode and the first source of reference potential and a capacitance connected between the semiconductor diode and the input connection of the RF amplifier circuit means.

7. The combination in accordance with claim 6 wherein said semiconductor diode is a PIN diode.

* * * * *